United States Patent
Kitano (10) Patent No.: US 8,164,144 B2
(45) Date of Patent: Apr. 24, 2012

(54) SEMICONDUCTOR DEVICE AND MANUFACTURING METHOD THEREOF

(75) Inventor: Yoji Kitano, Suwa (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 12/720,180

(22) Filed: Mar. 9, 2010

(65) Prior Publication Data

US 2010/0244134 A1    Sep. 30, 2010

(30) Foreign Application Priority Data

Mar. 25, 2009   (JP) .................................. 2009-073815

(51) Int. Cl.
*H01L 27/12* (2006.01)
*H01L 21/782* (2006.01)

(52) U.S. Cl. ............. 257/348; 257/E27.112; 257/E21.7; 257/349; 438/155

(58) Field of Classification Search .................. None
See application file for complete search history.

(56) References Cited

U.S. PATENT DOCUMENTS

| | | | |
|---|---|---|---|
| 5,559,368 A * | 9/1996 | Hu et al. ........................ | 257/369 |
| 5,838,047 A * | 11/1998 | Yamauchi et al. ............. | 257/372 |
| 5,939,751 A * | 8/1999 | Jang .............................. | 257/328 |
| 6,452,232 B1 * | 9/2002 | Adan ............................. | 257/347 |
| 6,521,948 B2 * | 2/2003 | Ebina ............................ | 257/347 |
| 6,693,328 B1 | 2/2004 | Kawanaka et al. | |
| 6,809,380 B2 | 10/2004 | Matsuhashi | |

FOREIGN PATENT DOCUMENTS

| | | |
|---|---|---|
| JP | 2004-119884 | 4/2004 |
| JP | 2004-128254 | 4/2004 |

* cited by examiner

*Primary Examiner* — Davienne Monbleau
*Assistant Examiner* — Joseph Schoenholtz
(74) *Attorney, Agent, or Firm* — Harness, Dickey & Pierce, P.L.C.

(57) ABSTRACT

A semiconductor device includes a semiconductor layer on an insulating layer, and a first partially depleted transistor and a first diode in the semiconductor layer. The first transistor has a first gate electrode above the semiconductor layer via an insulating film and a first source or drain of a first conductivity type in the semiconductor layer below both sides of the gate electrode. The first diode has a first impurity layer of a second conductivity type in a shallow portion of the semiconductor layer and a second impurity layer of the first conductivity type in a deep portion of the semiconductor layer. The first and second impurity layers are stacked in a depth direction of the semiconductor layer. The side surfaces of the first and second impurity layers contact the semiconductor layer just below the first gate electrode.

8 Claims, 10 Drawing Sheets

WHEN OFF

FIG. 6C

WHEN ON

SEMICONDUCTOR DEVICE AND MANUFACTURING METHOD THEREOF

The entire disclosure of Japanese Patent Application No. 2009-073815, filed Mar. 25, 2009 is expressly incorporated by reference herein.

BACKGROUND

1. Technical Field

The present invention relates to a semiconductor device provided with a partially depleted transistor in a semiconductor layer on an insulating layer and a manufacturing method of the semiconductor device.

2. Related Art

The development and practical application of a technology of forming a semiconductor device in a thin semiconductor film formed on an insulating film (silicon on insulator (SOI)) are underway for a low-power semiconductor device in the next generation. The SOI has advantages such as a high ON/OFF ratio or steep subthreshold characteristic of a drain current, low noise, and a low parasitic capacitance, and the application thereof to integrated circuits used for watches, mobile devices, and the like is underway. At present, a metal insulator semiconductor field effect transistor (MISFET) having an SOI structure is used for various semiconductor integrated circuits. Especially a MISFET having a partially depleted (PD) SOI structure (hereinafter referred to as a PD-SOI MISFET) that can be manufactured easily in the same manner as the manufacturing method of a MISFET having a bulk structure in the related art is widely applied to semiconductor products. The structure of the PD-SOI MISFET is disclosed in, for example, JP-A-2004-128254.

In the PD-SOI MISFET, a body region is electrically isolated from other regions by means of an element isolation film and an insulating layer (also referred to as a BOX layer), and the potential of the body region (that is, a body potential) floats. Therefore, the influence of a phenomenon called a substrate floating effect on device characteristics (for example, a history effect) has to be considered. The history effect is a phenomenon in which a body potential and a drain current fluctuate due to the history of voltage having been applied to a gate, a drain, and a source, causing unstable device characteristics.

Figure 10A:
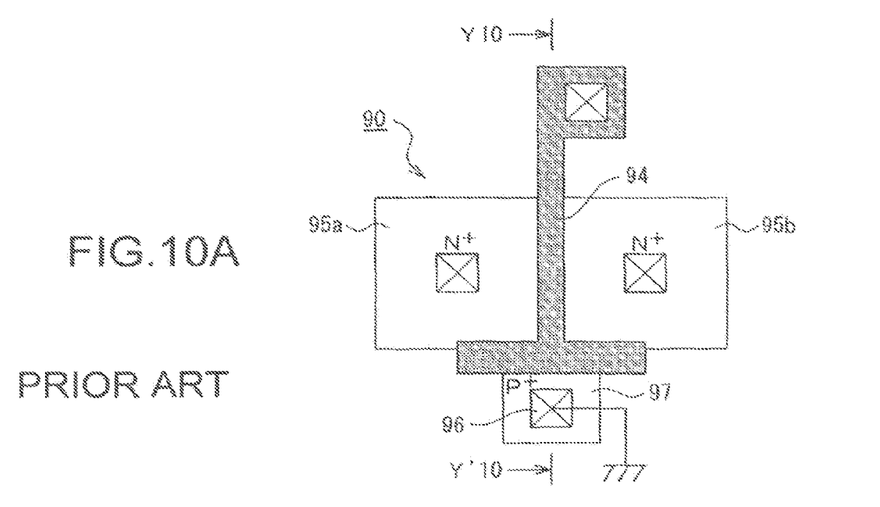
FIGS. 10A and 10B are diagrams showing an example of related art.
Figure 10B:
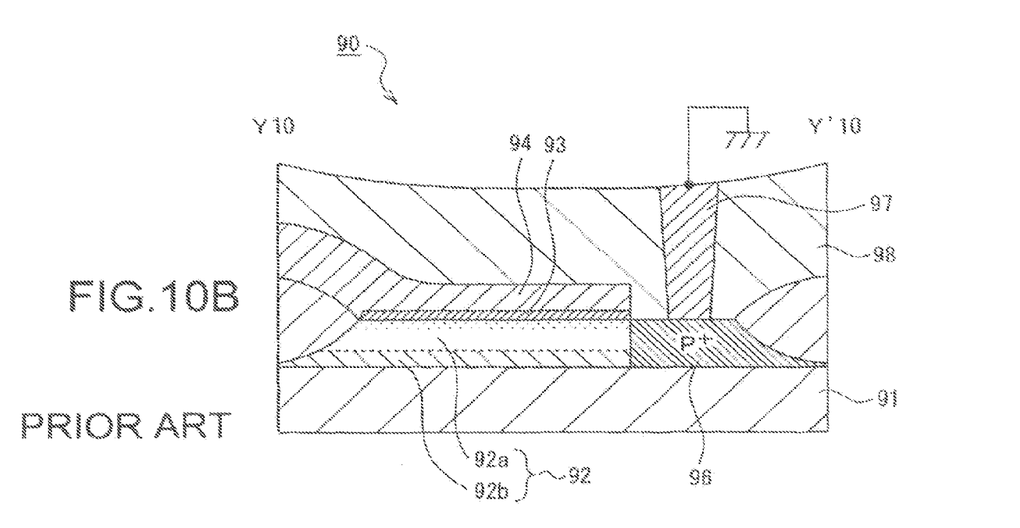

The history effect can be suppressed by a known body potential fixing method shown in, for example, FIGS. 10A and 10B.

FIGS. 10A and 10B are a plane view and a cross-sectional view showing a configuration example of a PD-SOI MISFET 90 according to the related art. As shown in FIGS. 10A and 10B, the PD-SOI MISFET 90 has a gate insulating film 93 formed on the surface of an SOI layer 92 on a BOX layer 91, a gate electrode 94 formed above the SOI layer 92 via the gate insulating film 93, an N-type source 95a or drain 95b formed in the SOI layer 92 below both sides of the gate electrode 94, and a P-type impurity layer 96 connected to the SOI layer 92 in a region just below the gate electrode 94 (that is, a body region).

In the PD-SOI MISFET 90, a depletion layer 92a does not reach the BOX layer 91, and a neutral region 92b is left, during its operation as shown in FIG. 10B. Since the potential of the body region 92 (that is, a body potential) is fixed to a desired potential (for example, a ground potential) via a contact 97 and the P-type impurity layer 96, the substrate floating effect is suppressed, and the history effect is suppressed. Such a structure is called body contact, or also called body tie, which is disclosed in, for example, JP-A-2004-119884. In FIG. 10A, the inter-layer insulating film 98 shown in FIG. 10B is omitted for avoiding complication of the drawing.

SUMMARY

In the PD-SOI MISFET 90, when the body potential is fixed (that is, in the case of the body contact), device characteristics become stable, but on the other hand, a parasitic capacitance is generated in the body region. Therefore, an ON current is reduced, leading to problems of a reduction in ON/OFF ratio or increase in subthreshold swing value (S value) of a drain current, and the like. That is, there is a problem in that the drive current of the PD-SOI MOSFET 90 is reduced, whereby the current drive ability thereof becomes substantially equal to that of bulk silicon. Therefore, in the structure shown in FIGS. 10A and 10B, it might be impossible to make full use of the advantages of the SOI.

An advantage of some aspects of the invention is to provide a semiconductor device in which a high ON/OFF ratio and stable operation can be realized simultaneously in a partially depleted transistor formed in a semiconductor layer on an insulating layer and a manufacturing method of the semiconductor device.

A first aspect of the invention is directed to a semiconductor device including: an insulating layer; a semiconductor layer formed on the insulating layer; a first partially depleted transistor formed in the semiconductor layer; and a first diode formed in the semiconductor layer, wherein the first transistor has a first gate electrode formed above the semiconductor layer via an insulating film and a first source or a first drain of a first conductivity type formed in the semiconductor layer below both sides of the gate electrode, the first diode has a first impurity layer of a second conductivity type formed in a shallow portion of the semiconductor layer and a second impurity layer of the first conductivity type formed in a deep portion of the semiconductor layer, the first impurity layer and the second impurity layer are stacked in a depth direction of the semiconductor layer, and a side surface of the first impurity layer and a side surface of the second impurity layer are in contact with the semiconductor layer in a region just below the first gate electrode.

Here, the "insulating layer" is also called a BOX layer, for example, and the "semiconductor layer" is also called an SOI layer, for example. The "partially depleted transistor" is a transistor in which during the operation of the transistor, a semiconductor layer in a region just below a gate electrode (that is, a body region) is not completely depleted but partially depleted (that is, a depletion layer does not reach an insulating layer, and a neutral region is left). The "first conductivity type" is one of P-type and N-type, while the "second conductivity type" is the other of P-type or N-type. The insulating film between the gate electrode and the semiconductor layer may be a gate oxide film formed by the thermal oxidation of the semiconductor layer or may be another insulating film (for example, a high-k film).

With such a configuration, when the first transistor is ON, the depletion layer generated in the body region extends downward, and the neutral region below the depletion layer forms a P-N-P (or N-P-N) structure via the second impurity layer and the first impurity layer stacked in a depth direction, for example. Accordingly, the body region and the fixation body electrode for fixing the potential of the body region (that is, a body potential) can be electrically isolated from each other. Therefore, the first transistor can have a structure in which the body potential floats (that is, a body floating structure).

When the first transistor is OFF, the body region forms a P-P (or N-N) structure via the first impurity layer of the diode. Therefore, the body region and the fixation body electrode can be electrically connected to each other. Accordingly, the first transistor can have a structure in which the body potential is fixed (that is, a body contact structure).

As described above, the first transistor can be switched between the body floating structure and the body contact structure in accordance with the ON and OFF of the first transistor. In this case, the ON current of the first transistor is increased due to the effect of body floating, while the OFF current is reduced due to the effect of body contact. Since the body potential is reset due to the effect of body contact when the first transistor is OFF, the history effect is suppressed in the first transistor. Accordingly, a high ON/OFF ratio and stable operation can be realized simultaneously in the first transistor.

It is preferable in the semiconductor device that the boundary between the first impurity layer and the second impurity layer be located at a depth from the surface of the semiconductor layer shallower than the boundary between a neutral region and a depletion layer generated in the semiconductor layer in the region just below the first gate electrode when at least a threshold voltage is applied to the first gate electrode. With such a configuration, when the first transistor is ON, the neutral region can only be in contact with the first impurity layer of the diode and cannot be in contact with the second impurity layer.

It is preferable that the semiconductor device further include a sidewall formed on a side surface of the first gate electrode. With such a configuration, for example, when the first impurity layer is formed in the shallow portion of the semiconductor layer, an impurity of the second conductivity type can be ion implanted by using the sidewall as a mask. Therefore, the impurity of the second conductivity type can be hardly introduced to an end portion of the semiconductor layer on the side of the diode. In doing so, the concentration of impurity of the second conductivity type can be suppressed lower at the end portion, and the depletion layer easily extends at the end portion of the semiconductor layer when the first transistor is ON. Therefore, the body floating structure is easily formed.

It is preferable that the semiconductor device further include a third impurity layer of the second conductivity type formed at an end portion of the semiconductor layer in the region just below the first gate electrode on the side of the diode, and that a concentration of impurity of the second conductivity type in the third impurity layer is lower than that in a portion other than the end portion of the semiconductor layer in the region just below the first gate electrode. With such a configuration, the depletion layer easily extends at the end portion of the semiconductor layer when the first transistor is ON. Therefore, the body floating structure is easily formed.

It is preferable that the semiconductor device further include a second partially depleted transistor formed in the semiconductor layer and a second diode formed in the semiconductor layer, that the second transistor have a second gate electrode formed above the semiconductor layer via an insulating film and a second source or a second drain of the second conductivity type formed in the semiconductor layer below both sides of the second gate electrode, that the second diode have a fourth impurity layer of the first conductivity type formed in a shallow portion of the semiconductor layer and a fifth impurity layer of the second conductivity type formed in a deep portion of the semiconductor layer, that the fourth impurity layer and the fifth impurity layer be stacked in the depth direction of the semiconductor layer, that a side surface of the fourth impurity layer and a side surface of the fifth impurity layer be in contact with the semiconductor layer in a region just below the second gate electrode, and that the first transistor and the second transistor constitute an inverter circuit.

With such a configuration, when the second transistor is ON, the body region can have the body floating structure. When the second transistor is OFF, the body region can have the body contact structure. Accordingly, also in the second transistor in the same manner as in the first transistor, the ON current is increased, while the OFF current is reduced. Also the history effect is suppressed. Accordingly, it is possible to provide an inverter circuit in which a high ON/OFF ratio and stable operation are realized simultaneously.

A second aspect of the invention is directed to a method of manufacturing a semiconductor device, including: forming a first partially depleted transistor in a semiconductor layer on an insulating layer; and forming a first diode in which a first impurity layer and a second impurity layer are stacked in a depth direction of the semiconductor layer, wherein forming the first transistor includes forming a first gate electrode above the semiconductor layer via an insulating film and forming a first source or a first drain of a first conductivity type in the semiconductor layer below both sides of the gate electrode, and forming the first diode includes introducing an impurity of a second conductivity type to a shallow portion of the semiconductor layer to form the first impurity layer of the second conductivity type such that a side surface of the first impurity layer is in contact with the semiconductor layer in a region just below the first gate electrode and introducing an impurity of the first conductivity type to a deep portion of the semiconductor layer to form the second impurity layer of the first conductivity type such that a side surface of the second impurity layer is in contact with the semiconductor layer in the region just below the first gate electrode.

With such a manufacturing method, the first transistor can be switched between the body floating structure and the body contact structure in accordance with the ON and OFF of the first transistor. Therefore, it is possible to provide a semiconductor device in which a high ON/OFF ratio and stable operation can be realized simultaneously.

It is preferable that the manufacturing method further include forming a sidewall on a side surface of the first gate electrode, and that in forming the first impurity layer, the impurity of the second conductivity type be introduced to the shallow portion of the semiconductor layer by using the gate electrode and the sidewall as masks. With such a manufacturing method, the depletion layer easily extends at the end portion of the semiconductor layer when the first transistor is ON. Therefore, it is possible to provide a semiconductor device in which the body floating structure is easily formed.

It is preferable that the manufacturing method further include forming a third impurity layer of the second conductivity type at an end portion of the semiconductor layer in the region just below the first gate electrode on the side of the diode, and that a concentration of impurity of the second conductivity type in the third impurity layer be lower than that in a portion other than the end portion of the semiconductor layer in the region just below the first gate electrode. With such a manufacturing method, the depletion layer easily extends at the end portion of the semiconductor layer when the first transistor is ON. Therefore, it is possible to provide a semiconductor device in which the body floating structure is easily formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. In the drawings described below, the same reference numeral is assigned to a portion having the same configuration, and the repetitive description thereof is omitted.

1 First Embodiment

Figure 1A:
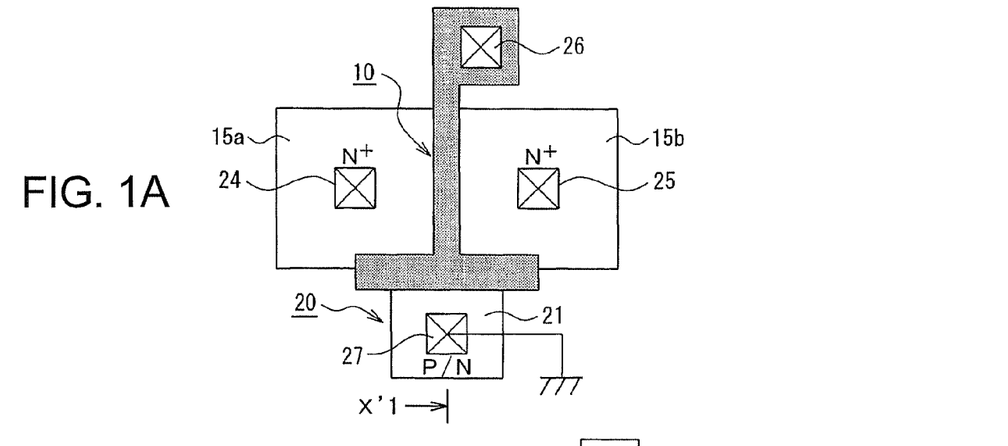
FIGS. 1A to 1C are diagrams showing a configuration example of a semiconductor device according to a first embodiment of the invention.
Figure 1B:
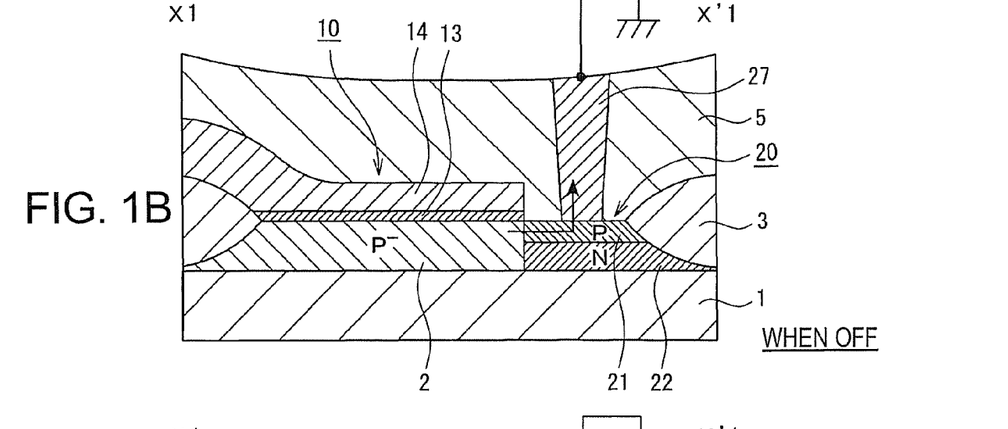
Figure 1C:
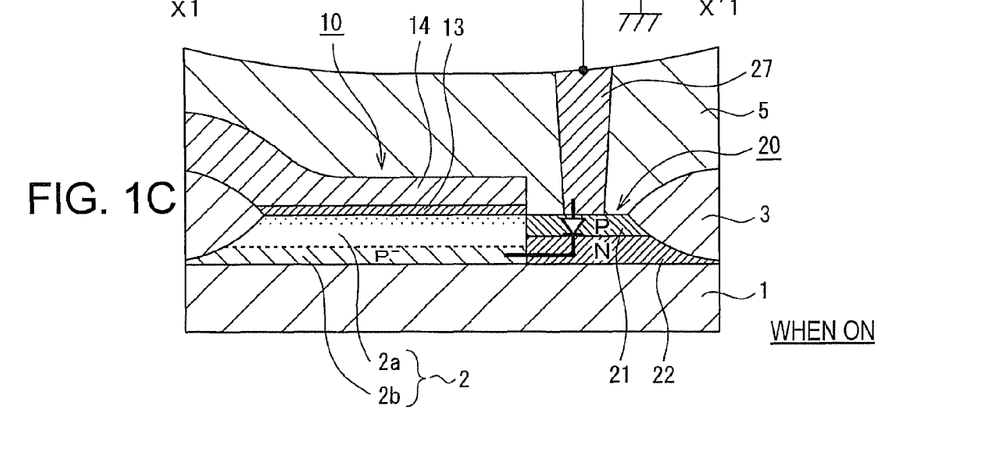

FIGS. 1A to 1C are a plan view and cross-sectional views showing a configuration example of a semiconductor device according to a first embodiment of the invention. FIG. 1B shows a state when a transistor is OFF, while FIG. 1C shows a state when the transistor is ON. In FIG. 1A, an inter-layer insulating film is omitted for avoiding complication of the drawing.

As shown in FIGS. 1A to 1C, the semiconductor device includes an N-channel transistor 10 formed in an SOI layer 2 on a BOX layer 1 and a PN junction diode 20. The BOX layer 1 is a silicon oxide film ($SiO_2$), for example. The SOI layer 2 is a single-crystal silicon layer (Si), for example. The transistor 10 and the diode 20 are covered with an inter-layer insulating film 5. One end of the diode 20 is electrically connected to a fixation body electrode 27 at a ground potential, for example.

The transistor 10 has, for example, a gate electrode 14 formed above the SOI layer 2 via an insulating film 13 and an N-type source 15a or drain 15b formed in the SOI layer 2 below both sides of the gate electrode 14. The insulating film 13 is a gate oxide film ($SiO_2$ or SiON) formed by, for example, the thermal oxidation of the SOI layer 2, or a high-k film. The gate electrode 14 is formed of polysilicon containing an impurity such as, for example, phosphorus or boron, or a metal. The transistor 10 is a partially depleted MISFET (that is, a PD-SOI MISFET). During the operation of the transistor (that is, when the transistor is ON by the application of at least a threshold voltage to the gate electrode 14), a depletion layer 2a does not reach the BOX layer 1, and a neutral region 2b is left, in the SOI layer 2 in a region just below the gate electrode 14 (that is, a body region) as shown in FIG. 1C.

The diode 20 has a P-type impurity layer 21 formed in a shallow portion of the SOI layer 2 and an N-type impurity layer 22 formed in a deep portion of the SOI layer 2. As shown in FIGS. 1B and 1C, the P-type impurity layer 21 and the N-type impurity layer 22 are stacked in a depth direction of the SOI layer 2. The lower surface of the P-type impurity layer 21 is in direct contact with the upper surface of the N-type impurity layer 22. A side surface of the P-type impurity layer 21 and a side surface of the N-type impurity layer 22 are in contact with the body region 2. In FIG. 1C, when attention is focused on the depth from the surface of the SOI layer 2, the boundary between the P-type impurity layer 21 and the N-type impurity layer 22 is located at a depth shallower than the boundary between the depletion layer 2a and the neutral region 2b.

In the semiconductor device, as shown in FIG. 1C, when the transistor 10 is ON, the depletion layer 2a extends downward. As a result, the neutral region 2b and the diode 20 form a P-N-P structure with respect to the fixation body electrode 27.

With this structure, the body region 2 can be isolated from the fixation body electrode 27, so that the transistor 10 can have a body floating structure. As shown in FIG. 1B, when the transistor 10 is OFF, the depletion of the body region 2 shrinks and the boundary between the body region 2 and the depletion layer rises. Therefore, the body region 2 and the P-type impurity layer 21 form a P-P structure with respect to the fixation body electrode 27. With this structure, the body region 2 can be electrically conducted to the fixation body electrode 27, so that the transistor 10 can have a body contact structure. Next, a method of manufacturing the semiconductor device will be described.

FIGS. 2A to 5B are flow sheets showing the method of manufacturing the semiconductor device according to the first embodiment of the invention.

Figure 2A:
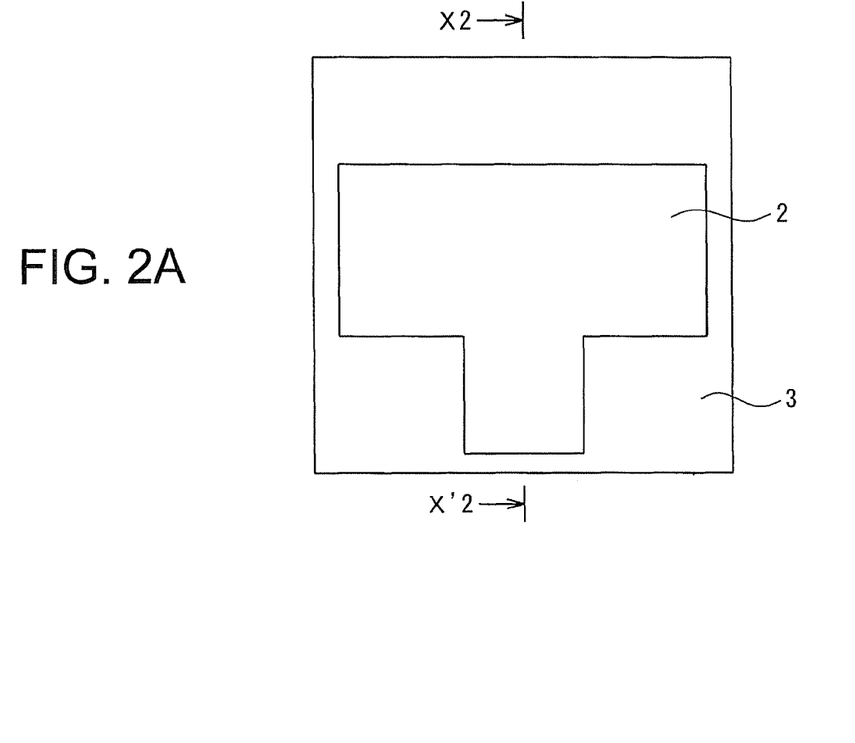
FIGS. 2A and 2B are diagrams showing a method of manufacturing the semiconductor device according to the first embodiment of the invention.
Figure 2B:
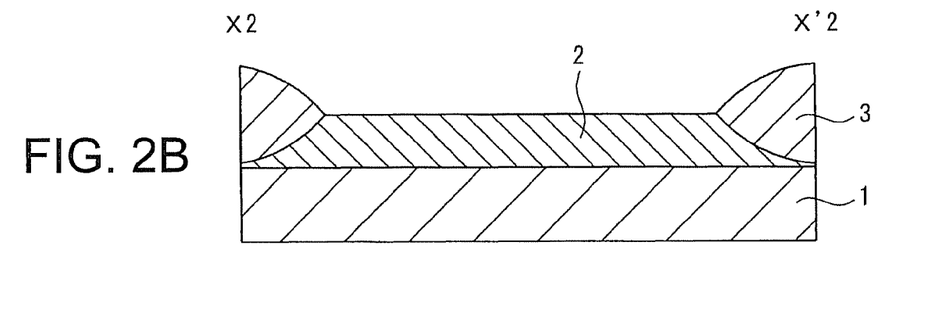

In FIGS. 2A and 2B, an SOI substrate having the BOX layer 1 formed on a supporting substrate (not shown) and the SOI layer 2 formed on the BOX layer 1 is first prepared. The SOI substrate is formed by, for example, a separation by implanted oxygen (SIMOX) process or a bonding process. Next, an element isolation layer 3 is formed on the SOI layer 2 by using a local oxidation of silicon (LOCOS) process, for example. A region surrounded by the element isolation layer 3 in a plan view serves as an element region.

Figure 3A:
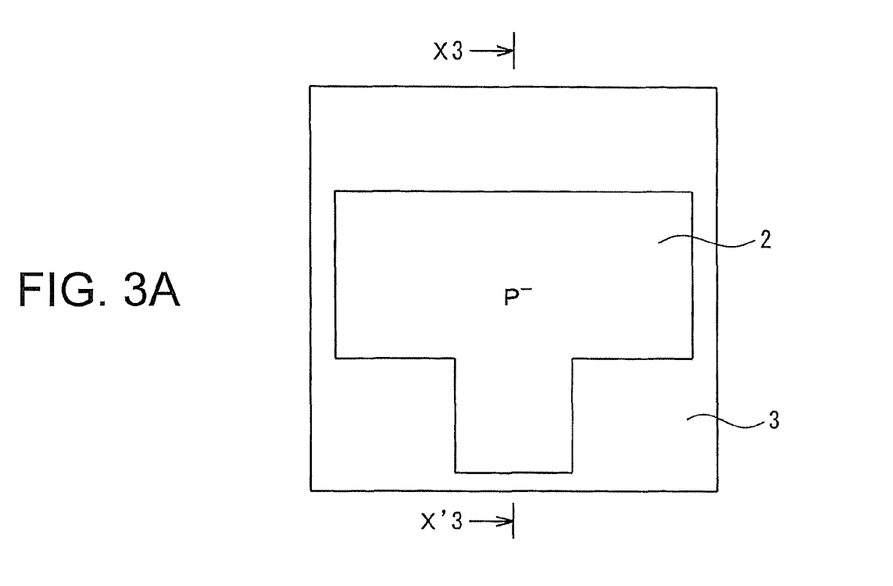
FIGS. 3A and 3B are diagrams showing the method of manufacturing the semiconductor device according to the first embodiment of the invention.
Figure 3B:
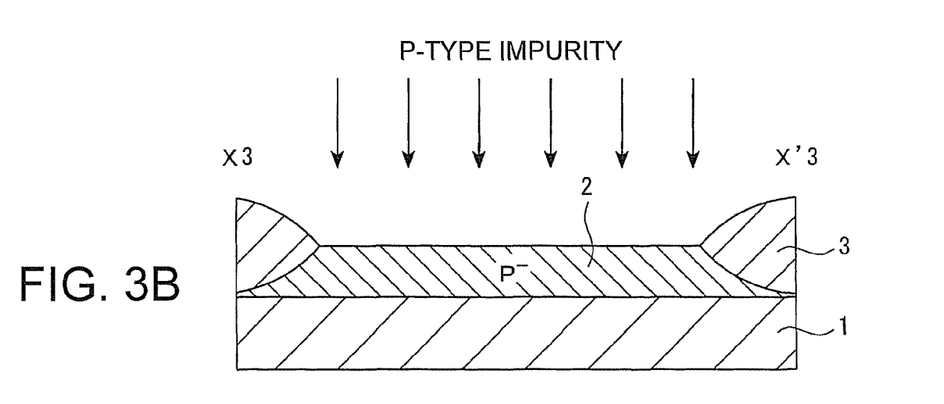

Next, as shown in FIGS. 3A and 3B, a P-type impurity such as boron, for example, is ion implanted into the SOI layer 2. This makes the conductivity type of the SOI layer 2 P-type. Next, the SOI layer 2 is subjected to thermal oxidation to form a gate insulating film on the surface of the SOI layer 2. A film (for example, a polysilicon film or a metal film) serving as the material of a gate electrode is formed on the gate insulating film, and the film is patterned to form the gate electrode.

Figure 4A:
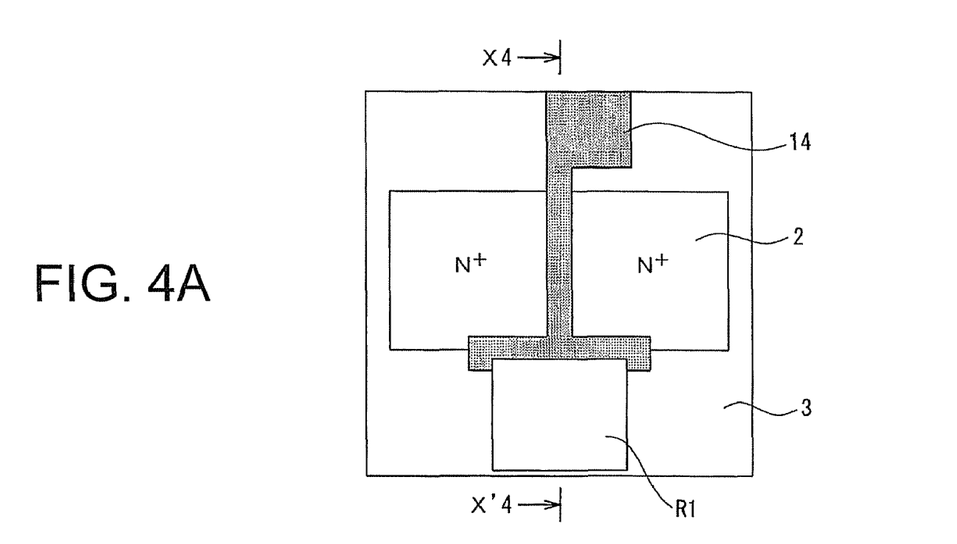
FIGS. 4A and 4B are diagrams showing the method of manufacturing the semiconductor device according to the first embodiment of the invention.
Figure 4B:
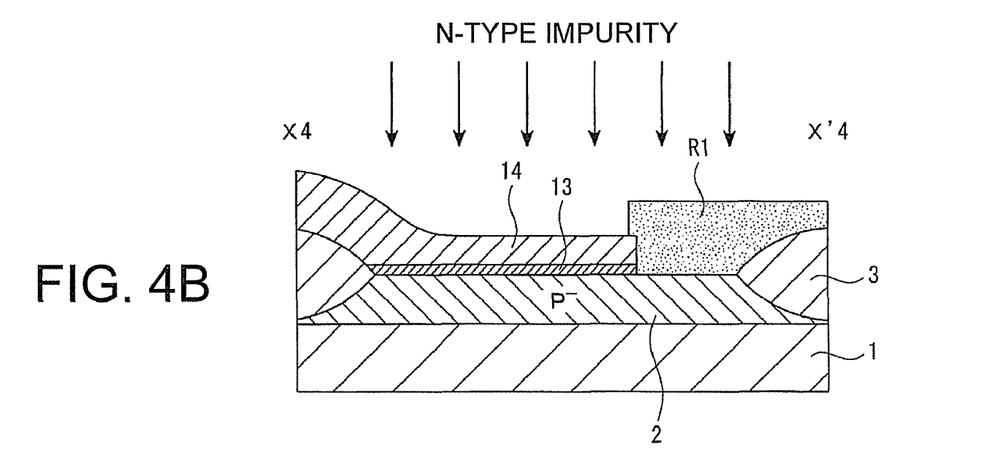

Next, as shown in FIGS. 4A and 4B, a region in which a diode is formed in the element region is covered with a resist pattern R1, for example. In this case, a region in which a transistor is formed in the element region is not covered with the resist pattern R1. An N-type impurity such as phosphorus or arsenic is ion implanted into the SOI layer 2 by using the gate electrode 14 and the resist pattern R1 as masks. In doing so, the source 15a or the drain 15b is formed in the SOI layer 2 below both sides of the gate electrode 14. In this step, since the body region 2 is masked with the gate electrode 14, and the region in which the diode is formed is masked with the resist pattern R1, the N-type impurity is not introduced into the regions. Therefore, the regions hold its P-type conductivity. After this step, the resist pattern R1 is removed from the region in which the diode is formed.

Figure 5A:
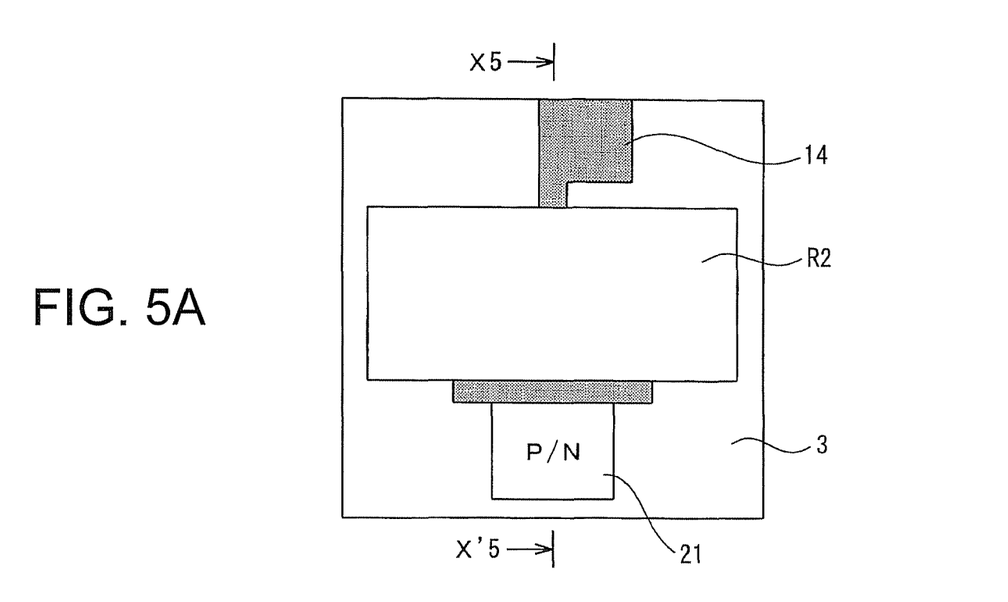
FIGS. 5A and 5B are diagrams showing the method of manufacturing the semiconductor device according to the first embodiment of the invention.
Figure 5B:
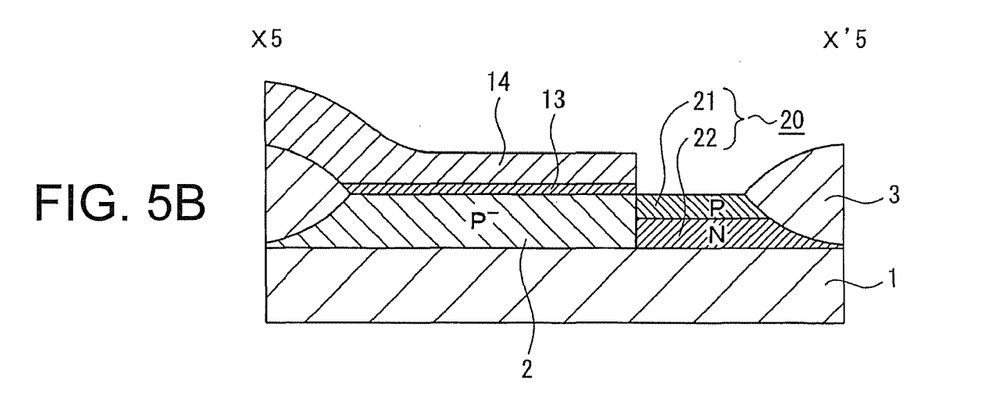

As shown in FIGS. 5A and 5B, the region in which the transistor is formed in the element region is covered with a resist pattern R2, for example. In this case, the region in which the diode is formed in the element region is not covered with the resist pattern R2. An N-type impurity such as phosphorus or arsenic is ion implanted by using the resist pattern R2 as a mask. In doing so, the N-type impurity layer 22 is formed in a deep portion of the SOI layer 2. In this case, the implantation energy is controlled such that almost all of the N-type impurity reaches the deep portion of the SOI layer 2 without remaining in a shallow portion of the SOI layer. Subsequently, a P-type impurity such as boron is ion implanted by using the resist pattern R2 as a mask to form the P-type impurity layer 21 in the shallow portion of the SOI layer 2. In this case, the implantation energy is controlled such that almost all of the P-type impurity remains in the shallow portion of the SOI layer 2 without reaching the deep portion of the SOI layer 2.

That is, the relation of E1>E2 is satisfied where E1 is the implantation energy of the impurity to the deep portion of the SOI layer 2, and E2 is the implantation energy of the impurity to the shallow portion of the SOI layer 2. In doing so, the PN junction diode 20 formed of the P-type impurity layer 21 and the N-type impurity layer 22 is formed. After this step, the resist pattern R2 is removed from the region in which the transistor is formed.

In the embodiment, the ion implantation to the shallow portion of the SOI layer 2 is not necessarily required. This is because the conductivity type of the SOI layer 2 is already turned into P-type in the step of FIGS. 3A and 3B. When the P-type impurity is ion implanted in the step of FIGS. 5A and 5B, the concentration of the P-type impurity in the P-type impurity layer 21 can be higher than that of the body region. When the P-type impurity is not ion implanted in this step, the concentration of the P-type impurity in the P-type impurity layer 21 can be maintained equal to that of the body region.

Thereafter, the SOI substrate is subjected to heat treatment to diffuse the P-type impurity and the N-type impurity introduced to the SOI layer 2. Next, an inter-layer insulating film (not shown) is deposited on the SOI substrate. An opening (not shown) is formed on the source 15a, the drain 15b, the gate electrode 14, and the diode 20. Further, a conductive material such as tungsten, for example, is buried in the openings to form electrodes 24 to 27 (refer to FIG. 1A). In doing so, the semiconductor device shown in FIGS. 1A to 1C is completed.

According to the first embodiment of the invention as described above, when the transistor 10 is ON, the depletion layer 2a extends downward, and the neutral region 2b below the depletion layer 2a forms the P-N-P structure via the N-type impurity layer 22 and the P-type impurity layer 21. Accordingly, the body region 2 and the fixation body electrode 27 can be electrically isolated from each other, so that the transistor 10 can have the body floating structure. When the transistor 10 is OFF, the body region 2 forms the P-P structure via the P-type impurity layer 21, so that the body region 2 and the fixation body electrode 27 can be electrically connected to each other. Accordingly, the transistor 10 can have the body contact structure.

As described above, the transistor 10 can be switched between the body floating structure and the body contact structure in accordance with the ON and OFF of the transistor. In this case, the ON current of the transistor 10 is increased due to the effect of body floating, while the OFF current is reduced due to the effect of body contact. Since the body potential is reset due to the effect of body contact when the transistor 10 is OFF, the history effect is suppressed in the transistor 10. Accordingly, a high ON/OFF ratio and stable operation can be realized simultaneously in the transistor 10.

In the first embodiment, the BOX layer 1 corresponds to an "insulating layer" of the invention, and the SOI layer 2 corresponds to a "semiconductor layer" of the invention. The transistor 10 corresponds to a "first transistor" of the invention, the gate electrode 14 corresponds to a "first gate electrode" of the invention, the source 15a corresponds to a "first source" of the invention, and the drain 15b corresponds to a "first drain" of the invention. The diode 20 corresponds to a "first diode" of the invention, the P-type impurity layer 21 corresponds to a "first impurity layer" of the invention, and the N-type impurity layer 22 corresponds to a "second impurity layer" of the invention.

Hereinafter, the reason why the OFF current is reduced in the invention will be described.

In a MISFET, impact ionization occurs (this is not a phenomenon inherent to SOI) under such a condition as a drain voltage $V_d > 1.1$ V. Here, the impact ionization is a phenomenon in that numerous electron-hole pairs are generated due to the collision of charged particles and Si atoms. That is, in the case where charged particles (electrons in the case of n, and holes in the case of p) flowing through a channel when the channel is ON are accelerated by an electric field near a drain and collide with Si atoms with an energy of a certain level or higher (about 1.5 eV or higher), Si atoms are ionized due to the energy and release electrons. Along with the release of electrons, holes are also generated. That is, numerous electron-hole pairs are generated due to the impact ionization.

In the case of an N-channel MISFET, the generated electrons flow to a drain at a high potential, while holes flow to a body region at a low potential (the flows of electrons and holes are reversed in the case of a P-channel MISFET). In the case of the N-channel MISFET, the body potential is increased due to the supply of holes. In the case of the P-channel MISFET, the body potential is reduced due to the supply of electrons. In either case, a threshold voltage Vth of the MISFET is reduced due to the impact ion. Further, carriers themselves are also increased in number, leading to an increase of the ON current. In the case of SOI, since the body floats, the influence is obviously large compared to the case of bulk.

Figure 11:
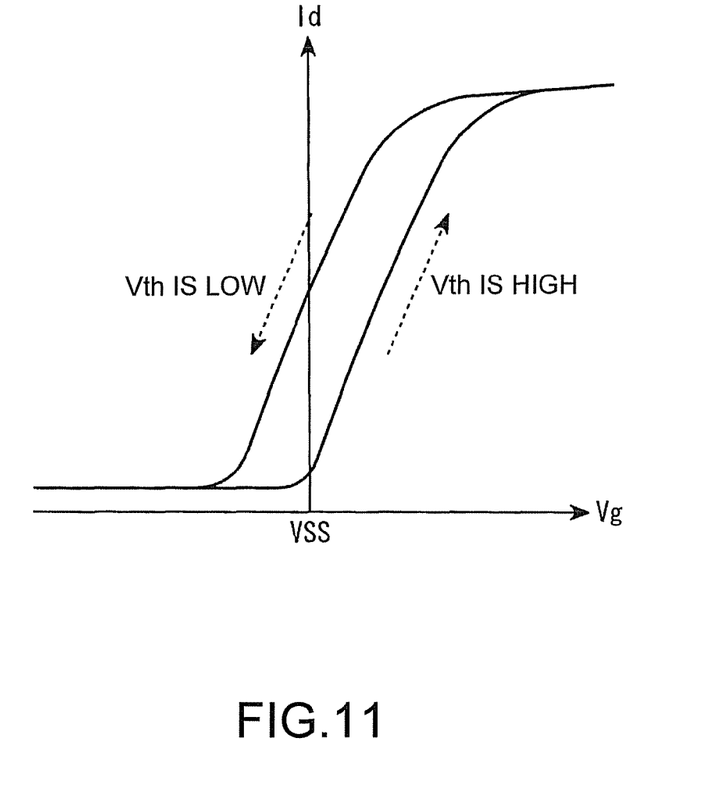
FIG. 11 is a diagram schematically showing a change in Vth due to impact ionization.

FIG. 11 schematically shows a change in Vth due to impact ionization in the case of an N-channel PD-SOI MISFET. When a channel current (that is, the ON current) flows, Vth is reduced due to impact ionization. Accordingly, since Vth is already reduced when the PD-SOI MISFET is changed from ON to OFF, the OFF current is increased. In the invention, on the other hand, since there is a path (for example, the P-type impurity layer 21) for discharging holes accumulated in the body region when the PD-SOI MISFET (for example, the transistor 10) is OFF, the OFF current can be reduced.

2 Second Embodiment

The first embodiment has described a case in which a "first conductivity type" of the invention is N-type, and a "second conductivity type" is P-type. However, the invention is not limited thereto. The "first conductivity type" may be P-type, and the "second conductivity type" may be N-type.

Figure 6A:
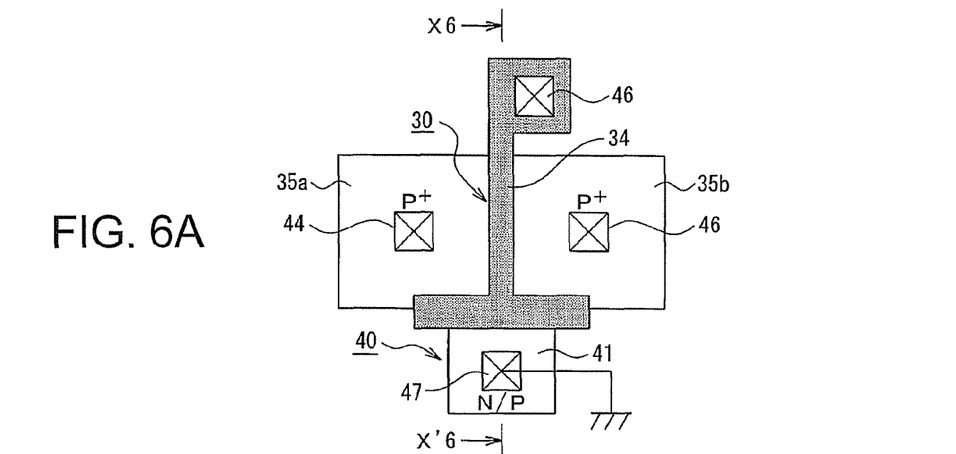
FIGS. 6A to 6C are diagrams showing a configuration example of a semiconductor device according to a second embodiment of the invention.
Figure 6B:
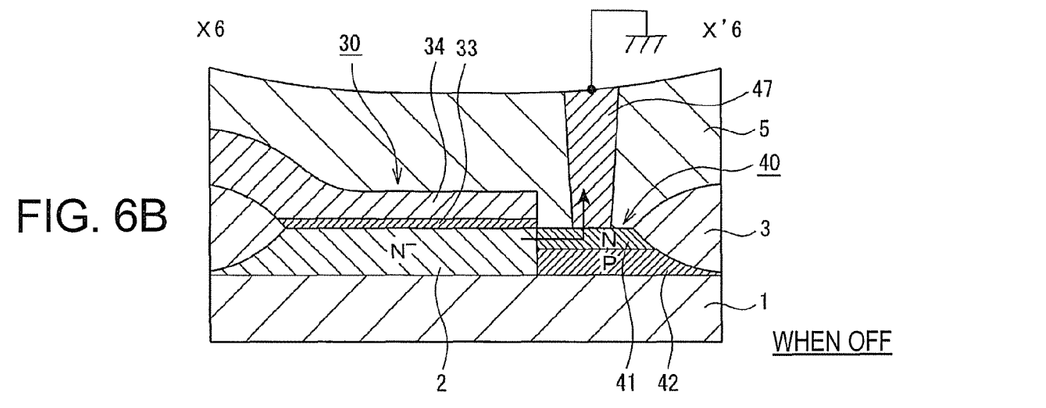
Figure 6C:
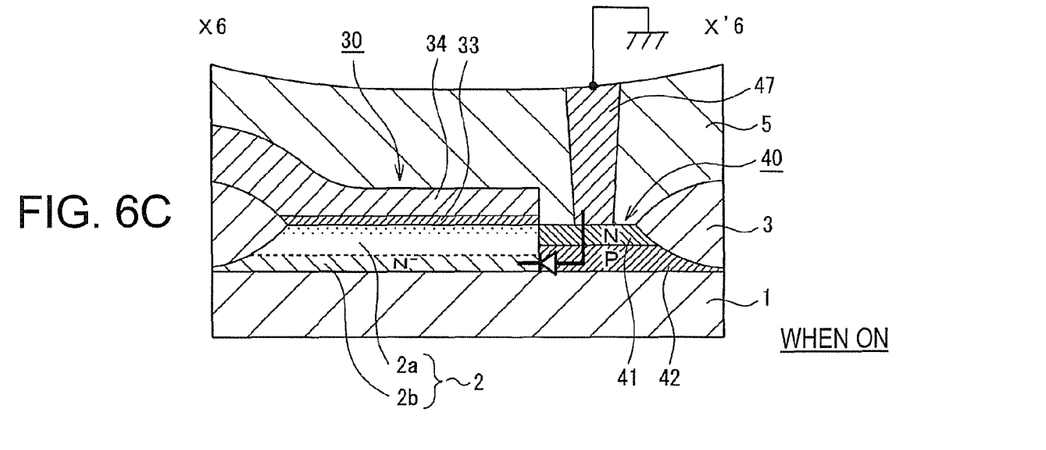

FIGS. 6A to 6C are a plan view and cross-sectional views showing a configuration example of a semiconductor device according to a second embodiment of the invention. FIG. 6B shows a state when a transistor is OFF, while FIG. 6C shows a state when the transistor is ON. In FIG. 6A, an inter-layer insulating film is omitted for avoiding complication of the drawing.

As shown in FIGS. 6A to 6C, the semiconductor device includes a P-channel transistor 30 formed in the SOI layer 2 on the BOX layer 1 and a PN junction diode 40. The transistor 30 and the diode 40 are covered with the inter-layer insulating film 5. One end of the diode 40 is electrically connected to a fixation body electrode 47 at a ground potential, for example.

The transistor 30 has, for example, a gate electrode 34 formed above the SOI layer 2 via an insulating film 33 and a P-type source 35a or drain 35b formed in the SOI layer 2 below both sides of the gate electrode 34. The insulating film 33 is, for example, a gate oxide film ($SiO_2$ or SiON) formed by the thermal oxidation of the SOI layer 2, or a high-k film. The gate electrode 34 is formed of polysilicon containing an impurity such as phosphorus or boron, for example. The transistor 30 is a PD-SOI MISFET. As shown in FIG. 3B, the depletion layer 2a does not reach the BOX layer 1, and the neutral region 2b is left, during the operation of the transistor.

The diode 40 has an N-type impurity layer 41 formed in a shallow portion of the SOI layer 2 and a P-type impurity layer 42 formed in a deep portion of the SOI layer 2. As shown in FIGS. 6B and 6C, the N-type impurity layer 41 and the P-type impurity layer 42 are stacked in a depth direction of the SOI layer 2. The lower surface of the N-type impurity layer 41 and the upper surface of the P-type impurity layer 42 are in direct contact with each other. As shown in FIG. 6C, the boundary between the N-type impurity layer 41 and the P-type impurity layer 42 is formed at a depth shallower than the boundary between the depletion layer 2a and the neutral region 2b. A side surface of the N-type impurity layer 41 and a side surface of the P-type impurity layer 42 are in contact with the body region 2.

In the semiconductor device, as shown in FIG. 6C, when the transistor 30 is ON, the depletion layer 2a extends downward, so that the neutral region 2b and the diode 40 form the N-P-N structure with respect to the fixation body electrode 47. With this structure, the body region 2 can be isolated from the fixation body electrode 47, so that the transistor 30 can have the body floating structure. As shown in FIG. 6B, when the transistor 30 is OFF, the depletion of the body region 2 is almost eliminated. Therefore, the body region 2 and the N-type impurity layer 41 form an N-N structure with respect to the fixation body electrode 47. With this structure, the body region 2 can be electrically conducted to the fixation body electrode 47, so that the transistor 30 can have the body contact structure.

According to the second embodiment of the invention as described above, the body floating structure can be formed when the transistor 30 is ON, while the body contact structure can be formed when the transistor 30 is OFF, in the same manner as in the first embodiment. Accordingly, a high ON/OFF ratio and stable operation can be realized simultaneously in the transistor 30.

In the second embodiment, the transistor 30 corresponds to the "first transistor" of the invention, the gate electrode 34 corresponds to the "first gate electrode" of the invention, the source 35a corresponds to the "first source" of the invention, and the drain 35b corresponds to the "first drain" of the invention. The diode 40 corresponds to the "first diode" of the invention, the N-type impurity layer 41 corresponds to the "first impurity layer" of the invention, and the P-type impurity layer 42 corresponds to the "second impurity layer" of the invention.

3 Third Embodiment

Figure 7:
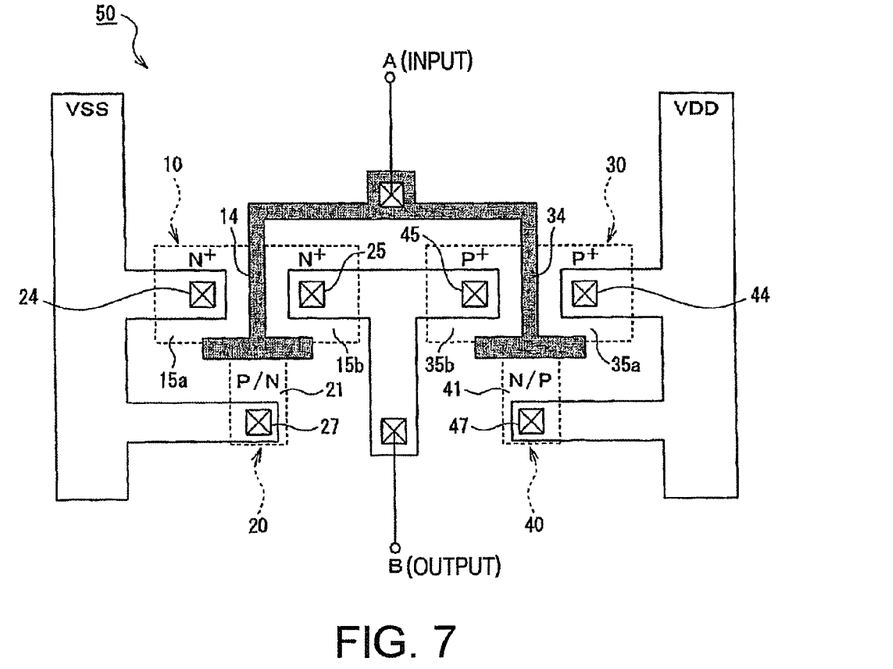
FIG. 7 is a diagram showing a configuration example of a semiconductor device according to a third embodiment of the invention.

FIG. 7 is a plan view showing a configuration example of a semiconductor device according to a third embodiment of the invention. As shown in FIG. 7, the semiconductor device has, for example, the transistor 10 and the diode 20, described in the first embodiment, and the transistor 30 and the diode 40, described in the second embodiment. The transistors 10 and 30 and the diodes 20 and 40 are combined to constitute a CMOS inverter circuit 50.

As shown in FIG. 7, in the CMOS inverter circuit 50, the source 15a of the transistor 10 and a power supply line VSS are electrically connected to each other. The drain 15b of the transistor 10 and the drain 35b of the transistor 30 are electrically connected to each other. The source 35a of the transistor 30 is electrically connected to a power supply line VDD. The P-type impurity layer 21 of the diode 20 is electrically connected to VSS. The N-type impurity layer 41 of the diode 40 is connected to VDD. The gate electrode 14 of the transistor 10 and the gate electrode 34 of the transistor 30 are both electrically connected to an input signal line A. The drain 15b of the transistor 10 and the drain 35b of the transistor 30 are both electrically connected to an output signal line B.

In the CMOS inverter circuit 50 having such a configuration, for example, when the potential of the input signal line A is at VDD (>VSS), the transistor 10 is ON, and the transistor 30 is OFF. Therefore, the potential of the output signal line B becomes substantially equal to VSS. Since the P-N-P structure is formed between the body region of the transistor 10 and VSS, the transistor 10 has the body floating structure. Accordingly, the ON current of the transistor 10 can be increased (compared to the body contact structure). On the other hand, since the N-N structure is formed between the body region of the transistor 30 and VDD, the transistor 30 has the body contact structure. Accordingly, the OFF current of the transistor 30 can be reduced (compared to the body floating structure). Further, since the body potential of the transistor 30 is reset due to the body contact structure, the history effect is suppressed in the transistor 30.

When the potential of the input signal line A is at −VDD (<VSS), the transistor 10 is OFF, and the transistor 30 is ON. Therefore, the potential of the output signal line B becomes substantially equal to VDD. Since the P-P structure is formed between the body region of the transistor 10 and VSS, the transistor 10 has the body contact structure. Accordingly, the OFF current of the transistor 10 can be reduced (compared to the body floating structure). Further, since the body potential of the transistor 10 is reset due to the body contact structure, the history effect is suppressed in the transistor 10. On the other hand, the N-P-N structure is formed between the body region of the transistor 30 and VDD, the transistor 30 has the body floating structure. Accordingly, the ON current of the transistor 30 can be increased (compared to the body contact structure).

According to the third embodiment of the invention as described above, since the transistors 10 and 30 and the diodes 20 and 40, described in the first and second embodiments, are applied, it is possible to provide the CMOS inverter circuit 50 in which a high ON/OFF ratio and stable operation are realized simultaneously.

In the third embodiment, the transistor 30 corresponds to a "second transistor" of the invention, the gate electrode 34 corresponds to a "second gate electrode" of the invention, the source 35a corresponds to a "second source" of the invention, and the drain 35b corresponds to a "second drain" of the invention. The diode 40 corresponds to a "second diode" of the invention, the N-type impurity layer 41 corresponds to a "fourth impurity layer" of the invention, and the P-type impurity layer 42 corresponds to a "fifth impurity layer" of the invention. The CMOS inverter circuit 50 corresponds to an "inverter circuit" of the invention. The other correspondence relations are the same as those in the first embodiment.

4 Other Embodiments

Figure 8:
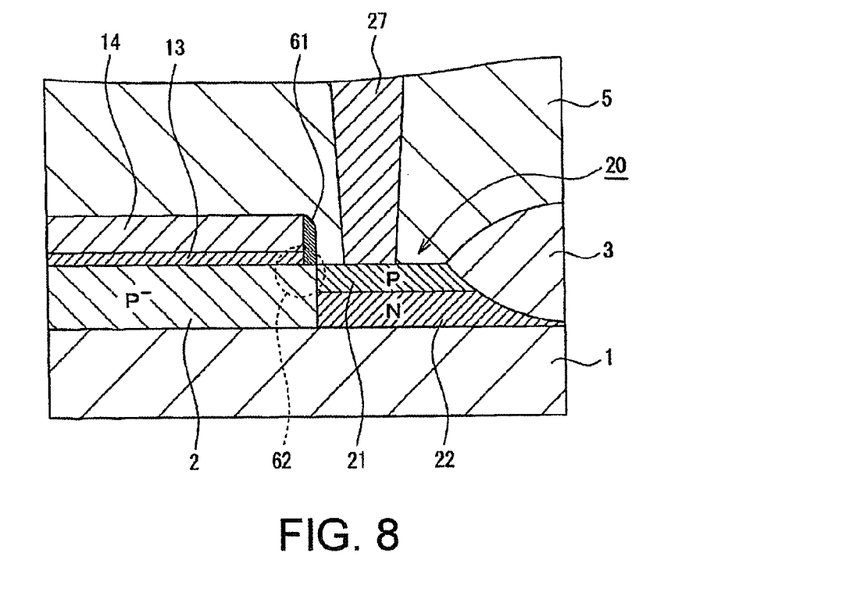
FIG. 8 is a diagram showing a configuration example of a semiconductor device according to a fourth embodiment of the invention.

In the invention, as shown in FIG. 8 for example, a sidewall 61 may be formed on a side surface of the gate electrode 14. With such a configuration, when the P-type impurity layer 21 is formed for example, a P-type impurity can be ion implanted by using the sidewall 61 as a mask, and the P-type impurity can hardly be introduced to an end portion 62 of the SOI layer 2 on the side of the diode 20. In doing so, since the depletion layer easily extends at the end portion 62, the P-N-P structure is easily formed when the transistor 10 is ON.

Figure 9:
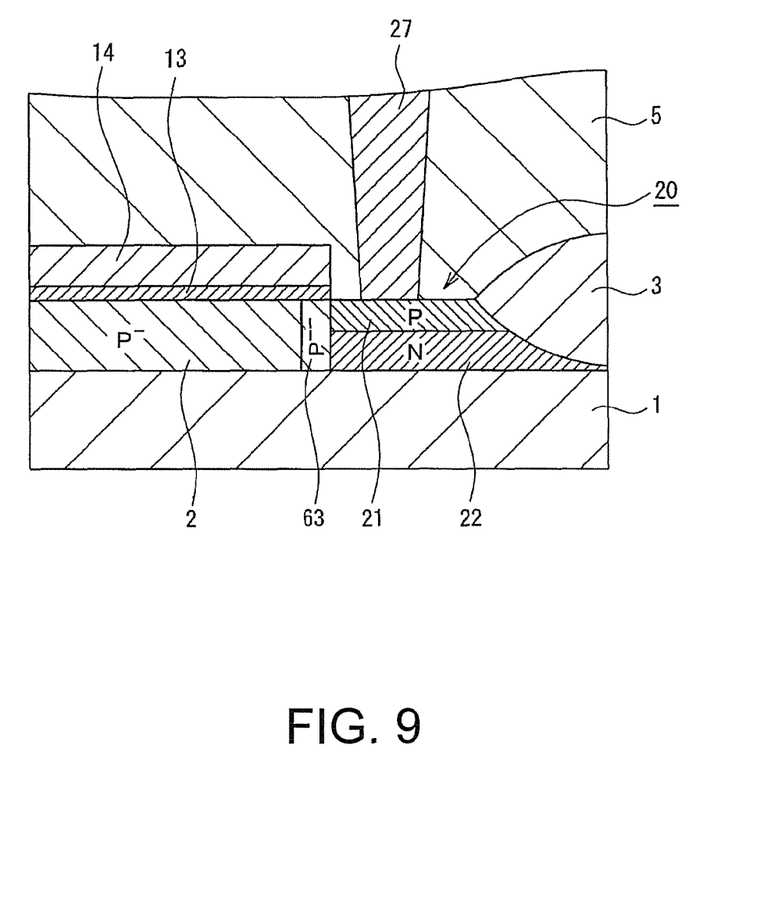
FIG. 9 is a diagram showing a configuration example of a semiconductor device according to a fifth embodiment of the invention.

Also in the invention, as shown in FIG. 9 for example, at an end portion of the body region 2 on the side of the diode 20, an impurity layer 63 having the same conductivity type as that of the body region 2 and a concentration of impurity lower than that of the body region 2 other than the end portion may be formed. For example, an N-type impurity such as phosphorus is ion implanted into the end portion to relatively lower the concentration of the P-type impurity, so that the impurity layer 63 of P⁻⁻ is formed with respect to the body region 2 of P⁻. With such a configuration, since the depletion layer easily extends in the impurity layer 63, the P-N-P structure is easily formed when the transistor 10 is ON.

Further in the invention, both of the sidewall 61 shown in FIG. 8 and the impurity layer 63 shown in FIG. 9 may be formed in the transistor 10. In doing so, the P-N-P structure is more easily formed. In this case, the impurity layer 63 corresponds to a "third impurity layer" of the invention.

What is claimed is:

1. A semiconductor device comprising:
    an insulating layer;
    a semiconductor layer formed on the insulating layer;
    a first partially depleted transistor formed in the semiconductor layer; and
    a first diode formed in the semiconductor layer, wherein the first transistor has
        a first gate electrode formed above the semiconductor layer via an insulating film and
        a first source or a first drain of a first conductivity type formed in the semiconductor layer below both sides of the gate electrode,
    the first diode has
        a first impurity layer of a second conductivity type formed in a shallow portion of the semiconductor layer and
        a second impurity layer of the first conductivity type formed in a deep portion of the semiconductor layer,
    the first impurity layer and the second impurity layer are stacked in a depth direction of the semiconductor layer, and
    a side surface of the first impurity layer and a side surface of the second impurity layer are in contact with the semiconductor layer in a region just below the first gate electrode.

2. The semiconductor device according to claim 1, wherein the boundary between the first impurity layer and the second impurity layer is located at a depth from the surface of the semiconductor layer shallower than the boundary between a neutral region and a depletion layer generated in the semiconductor layer in the region just below the first gate electrode when at least a threshold voltage is applied to the first gate electrode.

3. The semiconductor device according to claim 1, further comprising a sidewall formed on a side surface of the first gate electrode.

4. The semiconductor device according to claim 1, further comprising a third impurity layer of the second conductivity type formed at an end portion of the semiconductor layer in the region just below the first gate electrode on the side of the diode, wherein
    a concentration of impurity of the second conductivity type in the third impurity layer is lower than that in a portion other than the end portion of the semiconductor layer in the region just below the first gate electrode.

5. The semiconductor device according to claim 1, further comprising:
    a second partially depleted transistor formed in the semiconductor layer; and
    a second diode formed in the semiconductor layer, wherein the second transistor has
        a second gate electrode formed above the semiconductor layer via an insulating film and
        a second source or a second drain of the second conductivity type formed in the semiconductor layer below both sides of the second gate electrode,
    the second diode has
        a fourth impurity layer of the first conductivity type formed in a shallow portion of the semiconductor layer and
        a fifth impurity layer of the second conductivity type formed in a deep portion of the semiconductor layer,
    the fourth impurity layer and the fifth impurity layer are stacked in the depth direction of the semiconductor layer,
    a side surface of the fourth impurity layer and a side surface of the fifth impurity layer are in contact with the semiconductor layer in a region just below the second gate electrode, and
    the first transistor and the second transistor constitute an inverter circuit.

6. A method of manufacturing a semiconductor device, comprising:
    forming a first partially depleted transistor in a semiconductor layer on an insulating layer; and
    forming a first diode in which a first impurity layer and a second impurity layer are stacked in a depth direction of the semiconductor layer, wherein
    forming the first transistor includes
        forming a first gate electrode above the semiconductor layer via an insulating film and
        forming a first source or a first drain of a first conductivity type in the semiconductor layer below both sides of the gate electrode, and
    forming the first diode includes
        introducing an impurity of a second conductivity type to a shallow portion of the semiconductor layer to form the first impurity layer of the second conductivity type such that a side surface of the first impurity layer is in contact with the semiconductor layer in a region just below the first gate electrode and introducing an impurity of the first conductivity type to a deep portion of the semiconductor layer to form the second impurity layer of the first conductivity type such that a side surface of the second impurity layer is in contact with the semiconductor layer in the region just below the first gate electrode.

7. The method of manufacturing the semiconductor device according to claim 6, further comprising forming a sidewall on a side surface of the first gate electrode, wherein
in forming the first impurity layer, the impurity of the second conductivity type is introduced to the shallow portion of the semiconductor layer by using the gate electrode and the sidewall as masks.

8. The method of manufacturing the semiconductor device according to claim 6, further comprising forming a third impurity layer of the second conductivity type at an end portion of the semiconductor layer in the region just below the first gate electrode on the side of the diode, wherein
a concentration of impurity of the second conductivity type in the third impurity layer is lower than that in a portion other than the end portion of the semiconductor layer in the region just below the first gate electrode.

* * * * *